United States Patent
Margarit

(10) Patent No.: US 9,503,059 B1
(45) Date of Patent: Nov. 22, 2016

(54) INTEGRATED CIRCUIT DEVICES HAVING OSCILLATOR CIRCUITS THEREIN THAT SUPPORT FIXED FREQUENCY GENERATION OVER PROCESS-VOLTAGE-TEMPERATURE (PVT) VARIATIONS

(71) Applicant: Integrated Device Technology, Inc., San Jose, CA (US)

(72) Inventor: Mihai A. Margarit, San Jose, CA (US)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 14/871,319

(22) Filed: Sep. 30, 2015

(51) Int. Cl.
*H03K 3/011* (2006.01)
*H03B 5/24* (2006.01)
*H03K 3/0231* (2006.01)
*H03K 5/24* (2006.01)

(52) U.S. Cl.
CPC ............. *H03K 3/011* (2013.01); *H03B 5/24* (2013.01); *H03K 3/0231* (2013.01); *H03K 5/24* (2013.01)

(58) Field of Classification Search
CPC ...... H03K 3/011; H03K 3/0231; H03K 5/24; H03B 5/24
USPC ................................. 331/111, 143
See application file for complete search history.

(56) References Cited

U.S. PATENT DOCUMENTS

| | | | |
|---|---|---|---|
| 4,962,323 A | 10/1990 | Ta | |
| 5,397,936 A | 3/1995 | Wang | |
| 6,727,768 B1* | 4/2004 | Dasgupta | H03K 3/0231 331/1 A |
| 6,825,735 B2 | 11/2004 | Chung | |
| 7,034,627 B1* | 4/2006 | Kudari | H03K 3/0231 331/111 |
| 7,286,022 B2 | 10/2007 | Park et al. | |
| 7,385,453 B2* | 6/2008 | Nervegna | H03K 3/011 331/111 |
| 7,889,016 B2 | 2/2011 | Wang | |
| 7,907,021 B2* | 3/2011 | Chen | H03L 7/099 331/1 R |
| 8,232,846 B1 | 7/2012 | De Vita et al. | |
| 8,497,741 B2 | 7/2013 | Pedersen et al. | |
| 8,902,008 B1 | 12/2014 | De Vita et al. | |
| 9,019,018 B2 | 4/2015 | Leoncavallo | |

(Continued)

OTHER PUBLICATIONS

Bryson, Stephen W., "Using auto-zero comparator techniques to improve PWM performance (Part 1 of 2)", EE Times, Jun. 23, 2008 (4 pages).

(Continued)

*Primary Examiner* — Richard Tan
(74) *Attorney, Agent, or Firm* — Myers, Bigel & Sibley P.A.

(57) ABSTRACT

Oscillator circuits that support highly accurate fixed frequency generation over process, voltage and temperature (PVT) variations include a reference voltage generator, which is configured to generate a reference voltage across a resistor (e.g., high precision poly-resistor) therein. An auto-zeroing comparator is provided, which is configured to generate a differential clock signal (e.g., Ck, Ckb) at an output thereof. First and second switched capacitor circuits are further provided, which include matching first and second trim capacitors therein, respectively. The first and second switched capacitor circuits are configured to periodically drive respective first and second input terminals of the comparator at a first voltage level in an alternating back-and-forth sequence, in response to the reference voltage and a pair of switching signals derived from the differential clock signal.

16 Claims, 5 Drawing Sheets

(56) References Cited

U.S. PATENT DOCUMENTS

| | | | |
|---|---|---|---|
| 2004/0075599 A1* | 4/2004 | Jonsson | H03M 1/108 341/120 |
| 2010/0001887 A1 | 1/2010 | Motz | |
| 2015/0109049 A1* | 4/2015 | Huang | H02M 3/06 327/513 |

OTHER PUBLICATIONS

Paidimarri et al., "A 120nW 18.5kHz RC Oscillator with Comparator Offset Cancellation for ±0.25% Temperature Stability", 2013 IEEE International Solid-State Circuits Conference Digest of Technical Papers, Feb. 2013 (3 pages).

* cited by examiner

INTEGRATED CIRCUIT DEVICES HAVING OSCILLATOR CIRCUITS THEREIN THAT SUPPORT FIXED FREQUENCY GENERATION OVER PROCESS-VOLTAGE-TEMPERATURE (PVT) VARIATIONS

FIELD OF THE INVENTION

The present invention relates to integrated circuit devices and, more particularly, to periodic signal generators and methods of operating same.

BACKGROUND

Timing conditioning circuits used in dual data rate (DOR) register integrated circuits typically require a precise clock having a frequency variation of less than about +/−2.5% over process, voltage and temperature (PVT) variations. Typically, such a precise clock needs to be generated by the integrated circuit, but without an external reference frequency. This poses important design challenges for an on-chip oscillator given the fact that integrated circuit components such as capacitors and resistors can have variations of around +/−20% over process variations and +/−2% over temperature variations.

Some examples of oscillator circuits that utilize resistors and capacitors to generate periodic signals are disclosed in U.S. Pat. Nos. 8,232,846 and 8,902,008 to DeVita et al., entitled "Resistor Capacitor (RC) Oscillator." In these oscillator circuits, a current generator, a capacitor and a comparator are provided along with switch and clock generator logic. Additional examples of RC-based oscillator circuits are disclosed in U.S. Pat. No. 6,825,735 to Chung, entitled "Power Supply Voltage and Temperature-Independent RC Oscillator Using Controllable Schmitt Trigger," which utilizes a transition voltage generator circuit, a Schmitt trigger circuit, an RC delay circuit and a quantizer. The transition voltage generator circuit is disclosed as generating a high transition voltage and a low transition voltage. The high and low transition voltages are proportional to a power supply voltage. The Schmitt trigger circuit generates an output voltage having a first level when an input voltage becomes greater than the high transition voltage and having a second level when the input voltage becomes less than the low transition voltage. The RC delay circuit includes a resistor and a capacitor and generates the input voltage in response to the output voltage. The quantizer quantizes the input voltage to output a square-wave oscillation signal. Notwithstanding these RC-based oscillator circuits, there continues to be a need for oscillator circuits having higher degrees of precision when PVT variations are present.

SUMMARY OF THE INVENTION

Integrated circuit devices according to embodiments of the invention include oscillator circuits therein that support highly accurate fixed frequency generation over process, voltage and temperature (PVT) variations. In some of these embodiments of the invention, an oscillator circuit includes a reference voltage generator, which is configured to generate a reference voltage across a resistor (e.g., high precision poly-resistor) therein. A comparator is provided, which is configured to generate a differential clock signal (e.g., Ck, Ckb) at an output thereof. Preferably, an auto-zeroing comparator may be used to inhibit circuit glitches from causing parasitic switching of the comparator. First and second switched capacitor circuits are further provided, which include matching first and second trim capacitors therein, respectively. The first and second switched capacitor circuits are configured to periodically drive respective first and second input terminals of the comparator at a first voltage level in an alternating back-and-forth sequence, in response to the reference voltage and a pair of switching signals derived from the differential clock signal. In some cases, the differential clock signal may be fed back directly as the pair of switching signals.

According to additional embodiments of the invention, the reference voltage generator may include a current mirror, which is configured to: (i) generate a reference current and (ii) drive the resistor with a mirrored reference current to thereby support the reference voltage at a current carrying terminal of the resistor. In addition, the first and second trim capacitors may be high precision on-chip metal-on-metal (MOM) capacitors, which may be configured as respective binary-weighted arrays of capacitors. A voltage buffer may also be provided, which drives a shared reference node (with a buffered reference voltage) in response to the reference voltage. This shared reference node is electrically connected, in common, to the first and second switched capacitor circuits. According to some of these embodiments of the invention, the voltage buffer is configured as an operational amplifier having a first input terminal responsive to the reference voltage, a second input terminal and an output terminal electrically coupled to the shared reference node and electrically shorted (as feedback) to the second input terminal.

According to still further embodiments of the invention, the first switched capacitor circuit includes a first pair of switches (e.g., CMOS transmission gates), which are responsive to the pair of switching signals. In particular, a first one of the first pair of switches has a first current carrying terminal electrically connected to the first trim capacitor and a second current carrying terminal electrically connected to the first input terminal of the comparator. A second one of the first pair of switches has a first current carrying terminal electrically connected to the shared reference node, which is common to the first and second switched capacitor circuits, and a second current carrying terminal electrically connected to the first input terminal of the comparator. Similarly, the second switched capacitor circuit includes a second pair of switches responsive to the pair of switching signals. A first one of the second pair of switches has a first current carrying terminal electrically connected to the second trim capacitor and a second current carrying terminal electrically connected to the second input terminal of the comparator. A second one of the second pair of switches has a first current carrying terminal electrically connected to the shared reference node and a second current carrying terminal electrically connected to the second input terminal of the comparator. Furthermore, the first switched capacitor circuit includes a first pull-down transistor electrically coupled across the first trim capacitor and the second switched capacitor circuit includes a second pull-down transistor electrically coupled across the second trim capacitor. The first and second pull-down transistors have respective first and second gate terminals responsive to true and complementary ones of the differential clock signal.

According to additional embodiments of the invention, the reference voltage generator may include a current mirror, which is configured to generate a reference current and drive the resistor with a mirrored reference current to thereby support the reference voltage at a current carrying terminal of the resistor. According to this embodiment of the invention, the first and second input terminals of the comparator are electrically connected to respective first and second comparator nodes of the current mirror. The current mirror may also include a plurality of PMOS pull-up transistors having commonly-connected source terminals. This plurality of PMQS pull-up transistors may include a first PMOS pull-up transistor connected in series with a current source, which generates a reference current (Iref). In addition, the first and second comparator nodes can be electrically connected to respective drain terminals of second and third ones of the plurality of PMOS pull-up transistors and the current carrying terminal of the resistor can be electrically connected to a drain terminal of a fourth one of the plurality of PMOS pull-up transistors, which drives the resistor with a mirrored reference current.

According to further embodiments of the invention, an oscillator circuit is provided, which includes a current mirror having a plurality of pull-up nodes therein. The current mirror includes a current source (Iref) electrically connected to a first of the plurality of pull-up nodes. A reference resistor is provided, which has a first current carrying terminal electrically connected to a second of the plurality of pull-up nodes. A comparator is provided, which is configured to generate a high fidelity and stable differential clock signal (Ck, Ckb) at an output thereof. The comparator (e.g., auto-zeroing) has a first input terminal electrically connected to a third of the plurality of pull-up nodes and a second input terminal electrically connected to a fourth of the plurality of pull-up nodes. First and second switched capacitor circuits are also provided, which include matching first and second trim capacitors therein, respectively. The first and second switched capacitor circuits are configured to periodically drive respective ones of the first and second input terminals of the comparator at a first voltage level in an alternating back-and-forth sequence, in response to the differential clock signal. These first and second switched capacitor circuits may share a common reference node, which is held at a fixed voltage (e.g., Vref2). This fixed voltage may be derived from a reference voltage (Vref1), which is generated at the first current carrying terminal of the reference resistor (e.g., polysilicon resistor). The first and second switched capacitor circuits may also include respective first and second pull-down transistors, which are electrically coupled across the first and second trim capacitors, respectively. These first and second pull-down transistors may have respective first and second gate terminals, which are responsive to true and complementary ones of the differential clock signal. Accordingly, each of the trim capacitors may be periodically discharged and reset according to the periodicity of the differential clock signal.

DETAILED DESCRIPTION OF EMBODIMENTS

Figure 1:
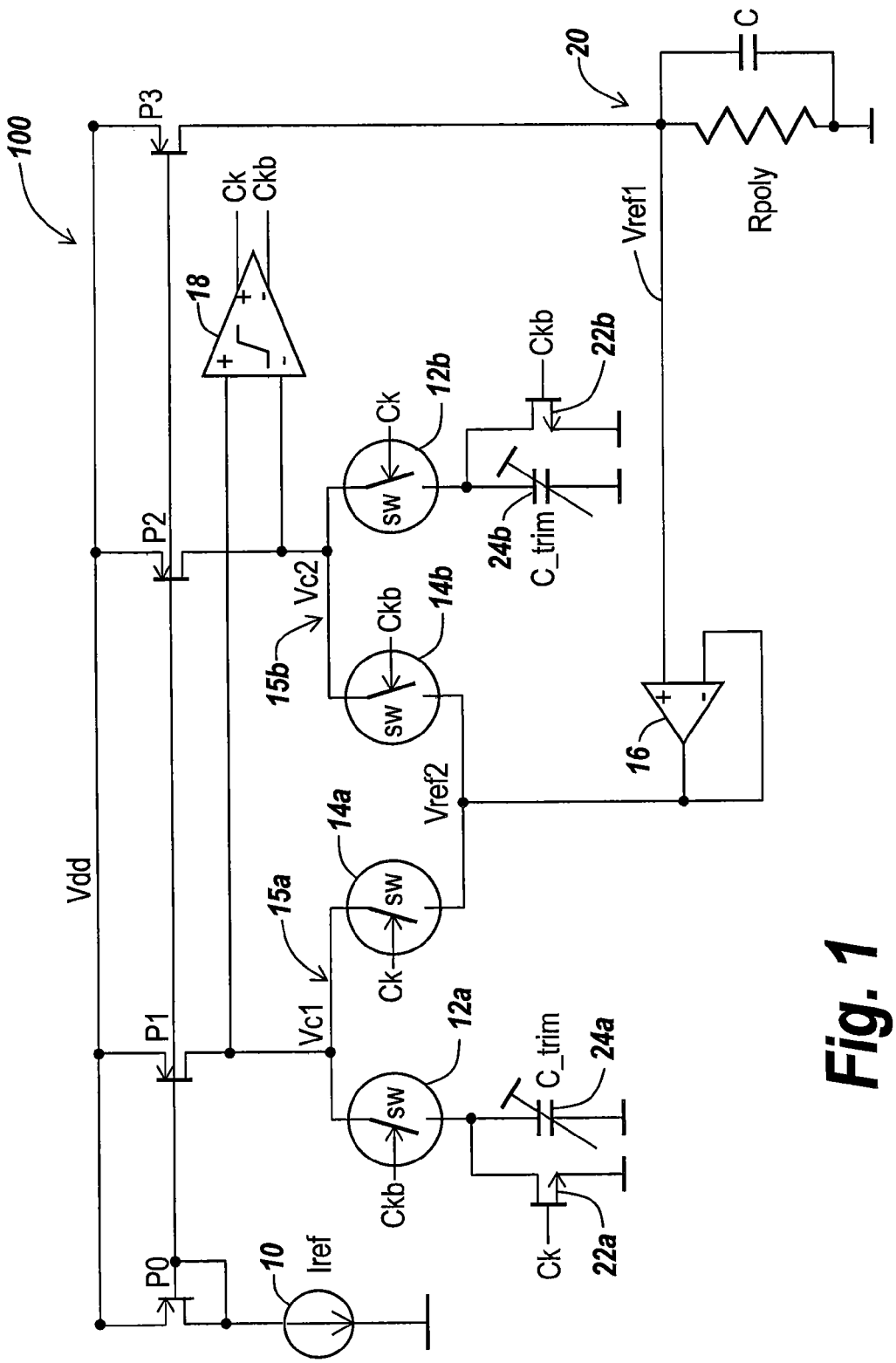
FIG. 1 is an electrical schematic of an RC-based oscillator circuit according to embodiments of the present invention.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that when an element or layer is referred to as being "on," "connected to" or "coupled to" another element or layer (and variants thereof), it can be directly on, connected or coupled to the other element or layer or intervening elements or layers may be present. In contrast, when an element is referred to as being "directly on," "directly connected to" or "directly coupled to" another element or layer (and variants thereof), there are no intervening elements or layers present. Like reference numerals refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Embodiments of the present invention are described herein with reference to cross-section and perspective illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a sharp angle may be somewhat rounded due to manufacturing techniques/tolerances.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Referring now to FIG. 1, an RC-based oscillator circuit 100 according to an embodiment of the present invention is illustrated as including a reference voltage generator, which is configured to generate a reference voltage (Vref1) across an RC voltage-supporting circuit 20 containing a resistor (e.g., high precision polysilicon resistor (Rpoly)) and parallel-connected capacitor C. As described hereinbelow, this resistor Rpoly is preferably a replica of the resistor used within the current source 10 to generate the reference current Iref. The oscillator circuit 100 also includes a comparator 18, which generates a differential clock signal (e.g., Ck, Ckb) at a dual-output thereof, as shown. According to preferred aspects of this embodiment, the comparator 18 is an auto-zeroing comparator that operates to inhibit circuit glitches from causing unwanted switching of the comparator 18. First and second switched capacitor circuits 15a, 15b are further provided, as illustrated. These switched capacitor circuits 15a, 15b include matching first and second trim capacitors 24a, 24b (C_trim) therein, which may be configured as equivalent binary-weighted arrays of high quality metal-on-metal (MOM) capacitors. As illustrated, the first and second switched capacitor circuits 15a, 15b are configured to periodically drive respective first and second input terminals of the comparator 18 at a first voltage level (e.g., Vc1=Vref2 or Vc2=Vref2) in an alternating back-and-forth sequence, in response to the reference voltage (Vref2=Vref1), which is supported at a shared reference node, and a pair of switching signals derived from the differential clock signal (Ck, Ckb). In some cases and as illustrated in FIG. 1, the differential clock signal (Ck, Ckb) may be fed back directly as the pair of switching signals Ck and Ckb. However, in alternative embodiments of the invention, the differential clock signal (Ck, Ckb) may be buffered, undergo a level shift, etc. before being utilized at the pair of switching signals.

The reference voltage generator of FIG. 1 further includes a current mirror that generates a reference current (Iref) via a current source 10 (left side) and drives the resistor Rpoly with a mirrored reference current (right side), which supports the reference voltage Vref1 at a current carrying terminal of the resistor Rpoly. This reference voltage Vref1 is provided as an input of a voltage buffer 16, which drives the shared reference node with a buffered reference voltage (i.e., Vref2). As shown, this shared reference node supporting Vref2 is electrically connected, in common, to the first and second switched capacitor circuits 15a, 15b. In addition, the voltage buffer 16 is configured as an operational amplifier having a first input terminal (+) responsive to the reference voltage Vref1, a second input terminal (−) and an output terminal electrically shorted to the shared reference node Vref2 and electrically shorted (as feedback) to the second input terminal (−). This configuration of the voltage buffer 16 operates to electrically isolate the reference voltage Vref1 generated across Rpoly from the switches 14a, 14b, which are connected to comparator nodes Vc1 and Vc2, respectively.

The first switched capacitor circuit 15a includes a first pair of switches 12a, 14a, which may be configured as CMOS transmission gates, for example. The control terminal (e.g., gate terminal) of switch 12a is shown as receiving complementary clock signal Ckb and the control terminal of switch 14a is shown as receiving true clock signal Ck. Switch 12a is also shown as having a first current carrying terminal electrically connected to the first trim capacitor 24a and a second current carrying terminal electrically connected to a first comparator node Vc1 and the first input terminal (+) of the comparator 18. Switch 14a is shown as having a first current carrying terminal electrically connected to the shared reference node Vref2 and a second current carrying terminal electrically connected to the first comparator node Vc1 and the first input terminal (+) of the comparator 18.

Similarly, the second switched capacitor circuit 15b includes a second pair of switches 12b, 14b, which may be configured as CMOS transmission gates. The control terminal (e.g., gate terminal) of switch 12b is shown as receiving true clock signal Ck and the control terminal of switch 14b is shown as receiving complementary clock signal Ckb. Switch 12b is also shown as having a first current carrying terminal electrically connected to the second trim capacitor 24b and a second current carrying terminal electrically connected to a second comparator node Vc2 and the second input terminal (−) of the comparator 18. Switch 14b is shown as having a first current carrying terminal electrically connected to the shared reference node Vref2 and a second current carrying terminal electrically connected to the second comparator node Vc2 and the second input terminal (−) of the comparator 18.

As further shown by FIG. 1, the first switched capacitor circuit 15a includes a first pull-down transistor 22a (e.g., NMOS), which is electrically coupled across the first trim capacitor 24a, and the second switched capacitor circuit 15b includes a second pull-down transistor 22b, which is electrically coupled across the second trim capacitor 24b. The first and second pull-down transistors 22a, 22b have respective first and second gate terminals responsive to true and complementary ones of the differential clock signal Ck, Ckb, which means the trim capacitors 24a, 24b are separately discharged in an alternating back-and-forth sequence as Ck and Ckb alternate between active phases (i.e., logic 1 intervals when Ck=1 or Ckb=1).

In addition to the current source 10, which generates a reference current Iref, the current mirror of FIG. 1 further includes four (4) PMOS pull-up transistors P0-P3, connected as illustrated with shared source terminals (at a power supply node Vdd) and commonly connected gate terminals. The gate and drain terminals of PMOS pull-up transistor P0 are connected to the current source 10, whereas the drain terminals of PMOS pull-up transistors P1 and P2 are connected to the first and second comparator nodes Vc1 and Vc2, respectively, and the drain terminal of PMOS pull-up transistor P3 is connected to the RC voltage-supporting circuit 20, which contains Rpoly.

Figure 2:
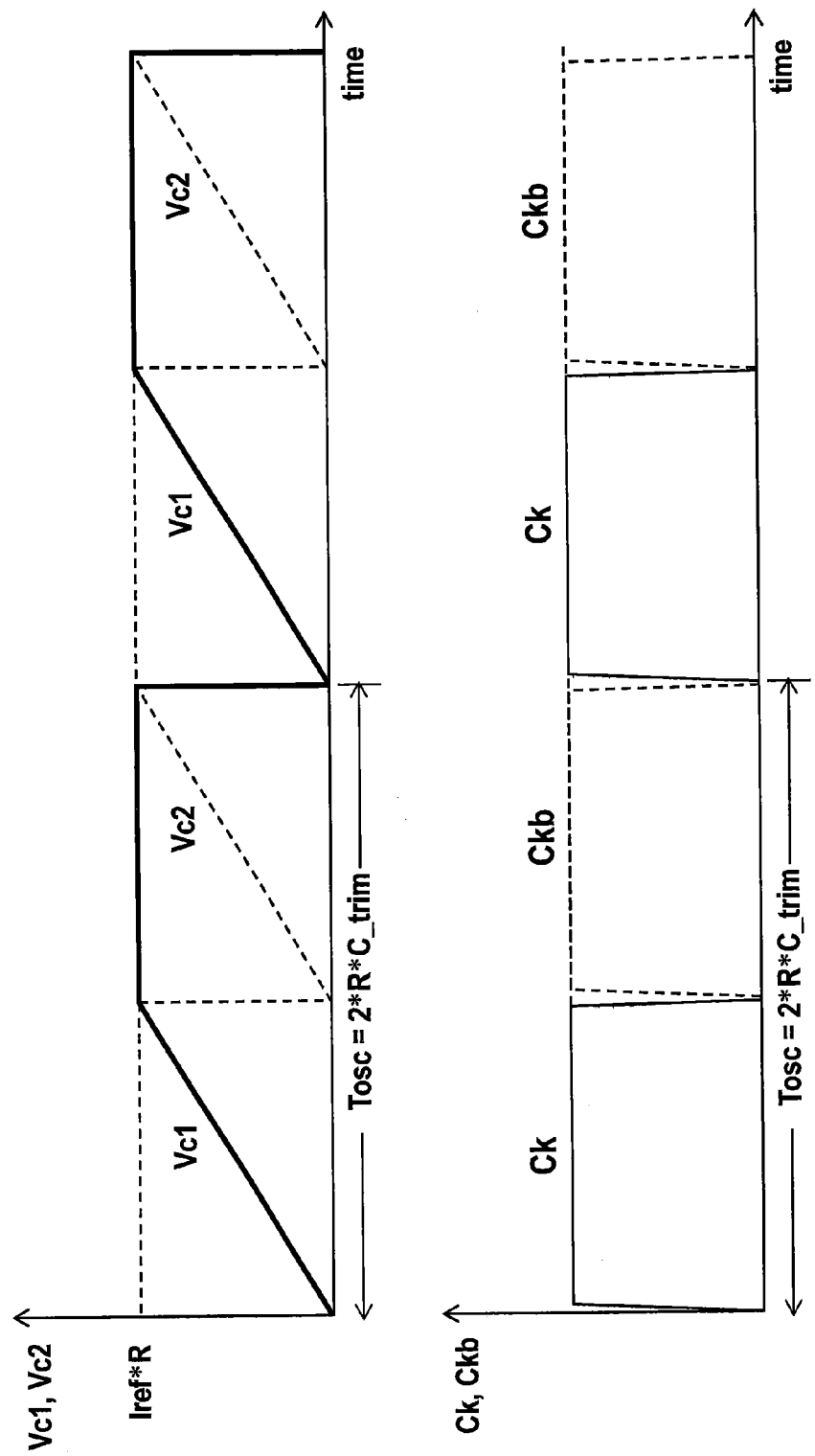
FIG. 2 is a timing diagram that highlights operation of the RC-based oscillator circuit of FIG. 1.
Figure 3:
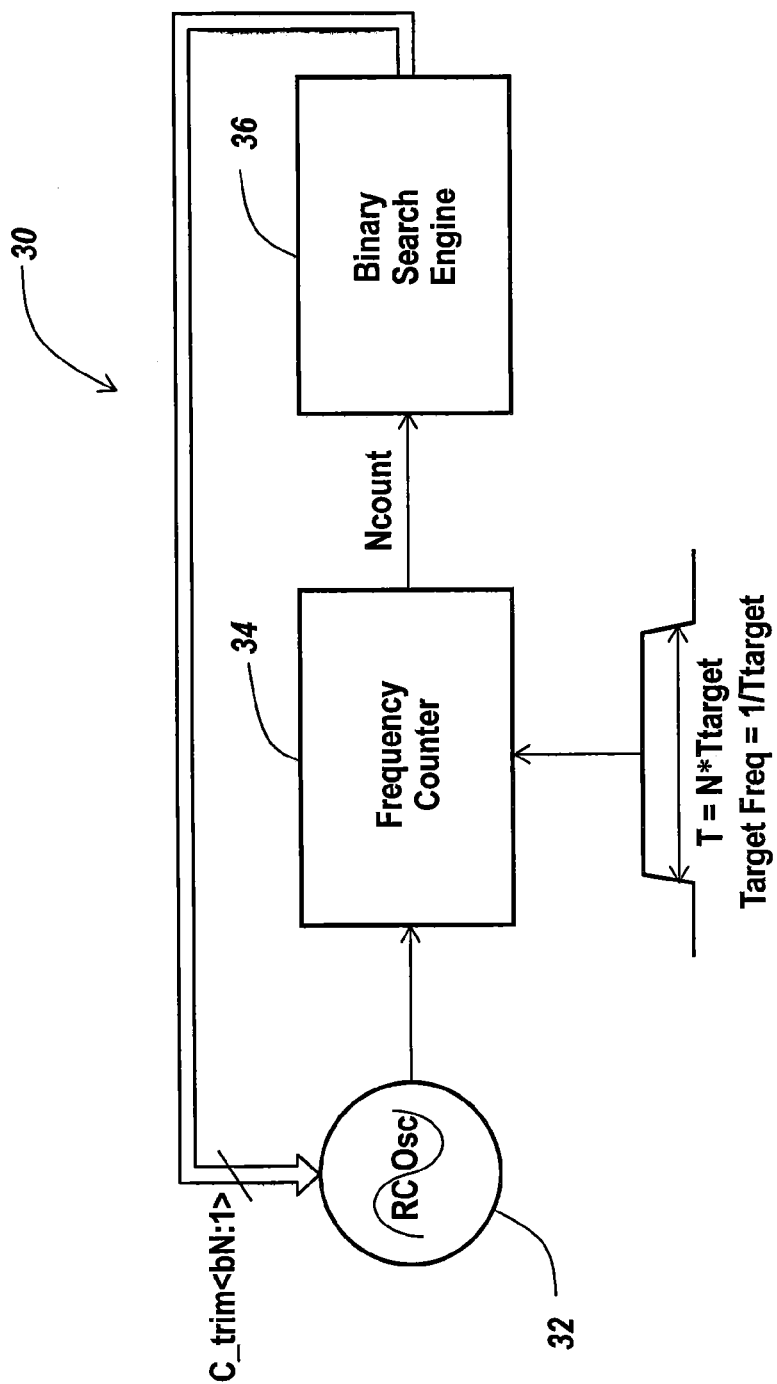
FIG. 3 is a block diagram of a calibration circuit that may be utilized during final testing to determine a binary word that sets a magnitude of the trim capacitors illustrated by FIG. 1.

As shown by FIGS. 1-2, the RC-based oscillator circuit 100 operates to charge high quality on-chip MOM capacitors 24a, 24b, which are trimmed to a desired value during calibration as shown by FIGS. 3-4, to a fixed reference voltage (Vref), which is generated across an on-chip poly resistor (Rpoly). By using a replica polysilicon resistor of a resistor within the current source 10, which generates the reference current Iref, the variation in Vref1 over process and temperature can be minimized to less than about 1%. The waveforms for nodes Vc1, Vc2, Ck, Ckb are shown in FIG. 2. As shown for nodes Vc1 and Vc2, the trim capacitors 24a, 24b are respectively charged at a constant slope of Iref/C_trim until Vc1 (or alternately Vc2) reaches Vref1/Vref2, when the comparator 18 flips the Ck and Ckb signals, thus starting to charge Vc2 (or alternately Vc1). The duration of the oscillation period (Tosc) is shown in FIG. 2 as 2(Rpoly)(C_trim). The topology of the oscillator circuit 100 in FIG. 1 is generally immune to mismatches between the two C_trim capacitors 24a, 24b as well as to DC offsets within the comparator 18. However, because glitches generated during switching can degrade the oscillation period Tosc, an auto-zeroing feature is utilized within the comparator 18 to prevent glitches from causing any parasitic switching of the comparator 18 that would degrade the oscillation period Tosc. A further improvement includes using an operational amplifier as the voltage buffer 16 to thereby block glitches in the reference voltage Vref1 from influencing nodes Vc1 and Vc2.

Figure 4A:
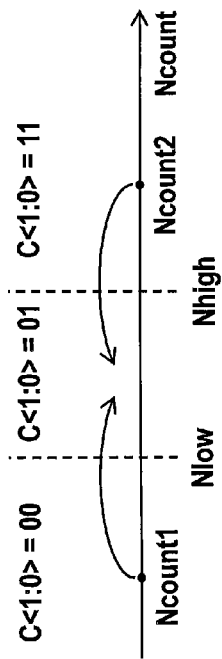
FIGS. 4A-4C illustrates calibration operations performed by the binary search engine of FIG. 3.
Figure 4B:
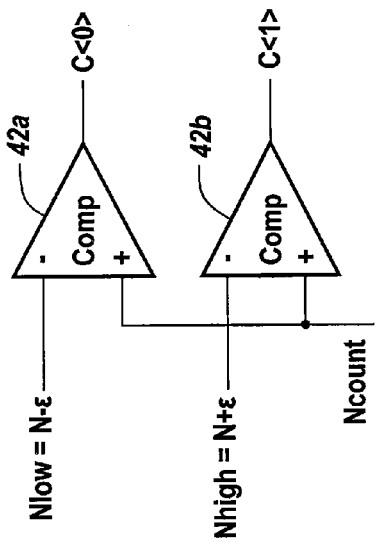
Figure 4C:
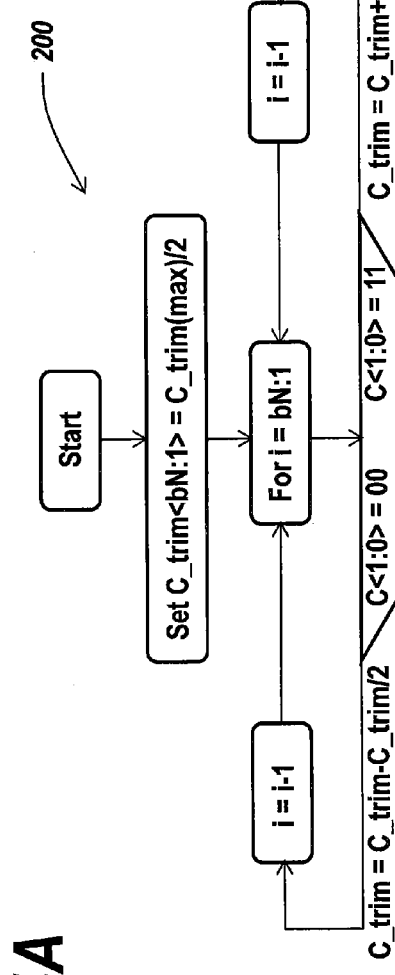

Referring now to FIGS. 3-4, the frequency variation of Ck and Ckb over process (P) can be calibrated automatically using a calibration circuit 30. This calibration circuit 30 includes a frequency counter 34 to generate a count (Ncount) and a binary search engine 36, which compares the number (N) of periods generated by an RC oscillator 32 (e.g., RC-based oscillator circuit 100) during a fixed time window (T=N(Ttarget)) with a desired target number of periods stored in the search engine 36. This autocalibration process, which can be performed during the final testing of an IC chip containing the oscillator circuit (32, 100), requires an external frequency generator to set a duration of the fixed time window (T). After calibration, the value of the C_trim word (C_trim<bN:1>, where "b" designates "binary"), is stored locally on the IC chip and loaded every time the chip powers up to thereby set the value of each binary array of MOM capacitors associated with C_trim 24a, 24b. As shown by FIGS. 4A-4C, the algorithm for the binary search engine 36 of FIG. 3 includes setting C_trim to a starting value (e.g., C_trim=C_trim(max)/2) and comparing the value of Ncount against a desired threshold count extending between Nlow and Nhigh, to thereby generate a two-bit comparison signal (C<0> and C<1>), as shown by FIG. 4A. As shown by FIGS. 4B-4C, if C<1:0>=00, which indicates a "too low" count below Nlow, the trim capacitance is reduced (e.g., C_trim (new)=C_trim (old)−C_trim (old)/2) for the next calibration iteration. However, if 0<1:0>=11, which indicates a "too high" count above Nhigh, the trim capacitance is increased (e.g., C_trim (new)=C_trim (old)+C_trim (old)/2) for the next calibration iteration. As shown by FIG. 4C, only when C<1:0>=01, which indicates that Ncount is within a necessary tolerance $\epsilon$, are the calibration operations complete.

Figure 5:
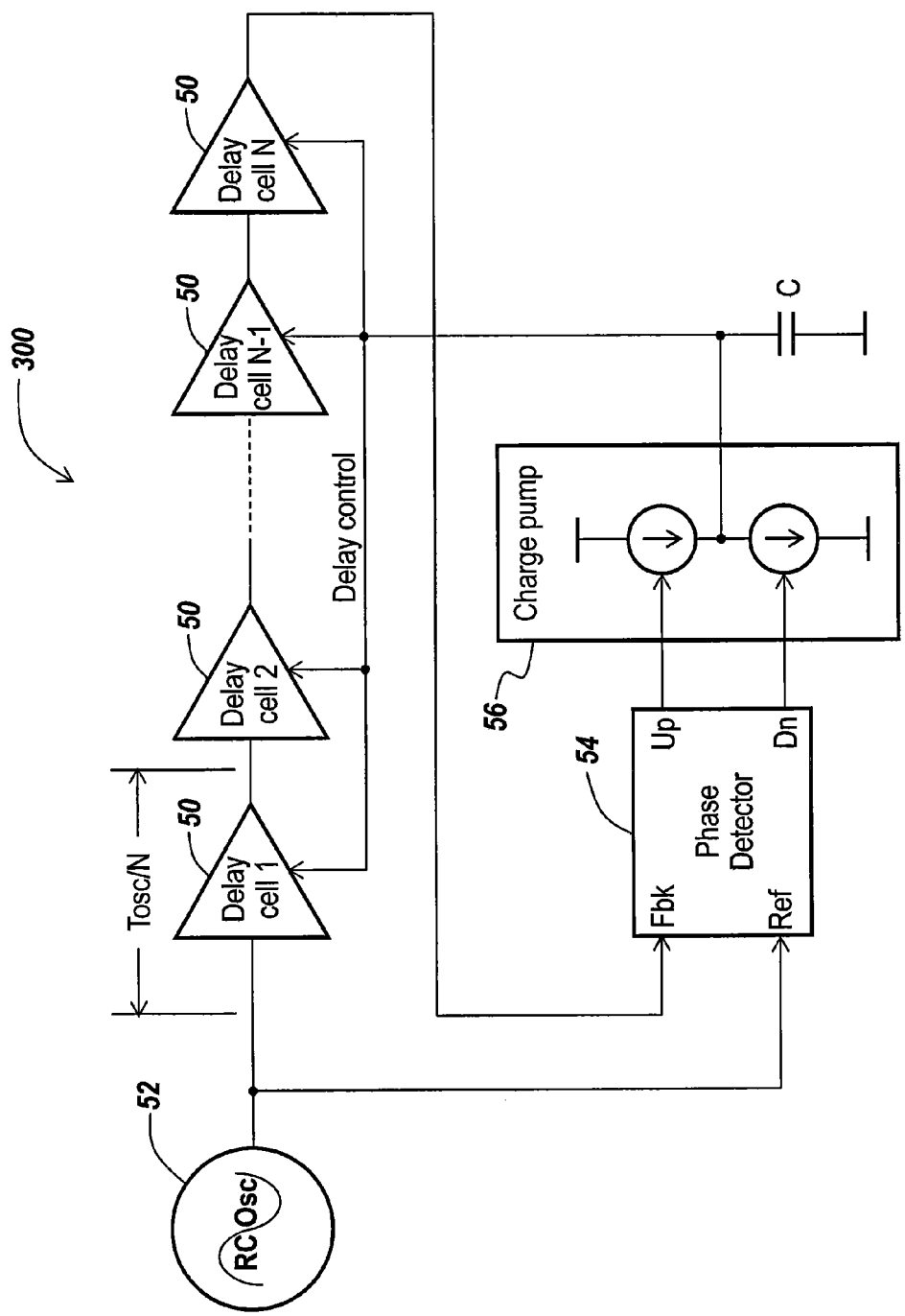
FIG. 5 illustrates an otherwise conventional delay-locked-loop (DLL) integrated circuit that receives a periodic input reference signal, which is generated by the RC-based oscillator circuit of FIG. 1.

Referring now to FIG. 5, the RC-based oscillator circuit 100 described herein may be used as an input oscillator 52 to an otherwise conventional delay-locked-loop (DLL) integrated circuit 300, which is shown as including N delay cells 50, which provide a fixed delay based on an input control signal (delay control). This control signal is generated by a charge pump 56, which is responsive to Up and Down charge pump driving signals generated by a phase detector 54. As will be understood by those skilled in the art, this phase detector 54 is responsive an output of the DLL, which is fed back to an input of the phase detector 54, and a periodic reference signal (Ref) generated by the input oscillator 52.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An oscillator circuit, comprising:
   a reference voltage generator configured to generate a reference voltage across a resistor therein;
   a comparator configured to generate a differential clock signal at an output thereof;
   first and second switched capacitor circuits comprising matching first and second trim capacitors therein, respectively, said first and second switched capacitor circuits configured to periodically drive respective first and second input terminals of said comparator at a first voltage level in an alternating back-and-forth sequence, in response to the reference voltage and a pair of switching signals derived from the differential clock signal; and
   a voltage buffer configured to drive a shared reference node that is common to the first and second switched capacitor circuits in response to the reference voltage.

2. The oscillator circuit of claim 1, wherein said reference voltage generator comprises a current mirror configured to generate a reference current and drive the resistor with a mirrored reference current to thereby support the reference voltage at a current carrying terminal of the resistor.

3. The oscillator circuit of claim 2, wherein the first and second trim capacitors are metal-on-metal (MOM) capacitors and the resistor is a polysilicon resistor.

4. The oscillator circuit of claim 2, wherein each of the first and second trim capacitors comprises a respective binary-weighted array of capacitors.

5. The oscillator circuit of claim 1, wherein said voltage buffer comprises an operational amplifier having a first input terminal responsive to the reference voltage, a second input terminal and an output terminal electrically coupled to the shared reference node and the second input terminal.

6. The oscillator circuit of claim 1, wherein said comparator is an auto-zeroing comparator.

7. The oscillator circuit of claim 1, wherein said first switched capacitor circuit comprises a first pair of switches responsive to the pair of switching signals; wherein a first one of the first pair of switches has a first current carrying terminal electrically connected to the first trim capacitor and a second current carrying terminal electrically connected to the first input terminal of said comparator; and wherein a second one of the first pair of switches has a first current carrying terminal electrically connected to a shared reference node that is common to the first and second switched capacitor circuits and a second current carrying terminal electrically connected to the first input terminal of said comparator.

8. The oscillator circuit of claim 7, wherein said second switched capacitor circuit comprises a second pair of switches responsive to the pair of switching signals; wherein a first one of the second pair of switches has a first current carrying terminal electrically connected to the second trim capacitor and a second current carrying terminal electrically connected to the second input terminal of said comparator; and wherein a second one of the second pair of switches has a first current carrying terminal electrically connected to the shared reference node and a second current carrying terminal electrically connected to the second input terminal of said comparator.

9. The oscillator circuit of claim 8, wherein said reference voltage generator comprises a current mirror configured to generate a reference current and drive the resistor with a mirrored reference current to thereby support the reference voltage at a current carrying terminal of the resistor; and wherein the first and second input terminals of said comparator are electrically connected to respective first and second comparator nodes of the current mirror.

10. The oscillator circuit of claim 8, wherein said first switched capacitor circuit comprises a first pull-down transistor electrically coupled across the first trim capacitor; wherein said second switched capacitor circuit comprises a second pull-down transistor electrically coupled across the second trim capacitor; and wherein the first and second pull-down transistors have respective first and second gate terminals responsive to true and complementary ones of the differential clock signal.

11. The oscillator circuit of claim 1, further comprising a calibration circuit configured to trim the first and second trim capacitors to respective capacitance values during a calibration operation.

12. The oscillator circuit of claim 9, wherein the current mirror comprises a plurality of PMOS pull-up transistors having commonly-connected source terminals; wherein the first and second comparator nodes are electrically connected to respective drain terminals of first and second ones of the plurality of PMOS pull-up transistors; and wherein the current carrying terminal of the resistor is electrically connected to a drain terminal of a third one of the plurality of PMOS pull-up transistors.

13. An oscillator circuit, comprising: a current mirror having a plurality of pull-up nodes therein, said current mirror comprising a current source electrically connected to a first of the plurality of pull-up nodes;

a reference resistor having a first current carrying terminal electrically connected to a second of the plurality of pull-up nodes;

a comparator configured to generate a differential clock signal at an output thereof, said comparator having a first input terminal electrically connected to a third of the plurality of pull-up nodes and a second input terminal electrically connected to a fourth of the plurality of pull-up nodes;

first and second switched capacitor circuits comprising matching first and second trim capacitors therein, respectively, said first and second switched capacitor circuits configured to periodically drive respective ones of the first and second input terminals of said comparator at a first voltage level in an alternating back-and-forth sequence, in response to the differential clock signal; and a voltage buffer configured to drive a common reference node associated with said first and second switched capacitor circuits at a fixed voltage in response to a reference voltage generated at the first current carrying terminal of said reference resistor.

14. The oscillator circuit of claim 13, wherein said voltage buffer is an operational amplifier having an output terminal electrically connected to the common reference node, a first input terminal responsive to the reference voltage generated at the first current carrying terminal of said reference resistor and a second input terminal electrically shorted to the output terminal.

15. The oscillator circuit of claim 13, wherein said comparator is an auto-zeroing comparator.

16. The oscillator circuit of claim 13, wherein said first and second switched capacitor circuits comprise respective first and second pull-down transistors electrically coupled across the first and second trim capacitors, respectively; and wherein the first and second pull-down transistors have respective first and second gate terminals responsive to true and complementary ones of the differential clock signal.

* * * * *